(12) United States Patent
Futatsuyama et al.

(10) Patent No.: US 7,274,603 B2
(45) Date of Patent: Sep. 25, 2007

(54) LEVEL SHIFTER CIRCUIT AND SEMICONDUCTOR MEMORY DEVICE USING SAME

(75) Inventors: Takuya Futatsuyama, Yokohama (JP); Ken Takeuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 11/330,143

(22) Filed: Jan. 12, 2006

(65) Prior Publication Data

US 2006/0186942 A1 Aug. 24, 2006

(30) Foreign Application Priority Data

Jan. 12, 2005 (JP) .............................. 2005-005070

(51) Int. Cl.
*G11C 7/00* (2006.01)
(52) U.S. Cl. .............................. 365/189.11; 365/185.23
(58) Field of Classification Search ........... 365/189.11, 365/185.23, 185.24
See application file for complete search history.

(56) References Cited

U.S. PATENT DOCUMENTS

| 5,031,149 | A | * | 7/1991 | Matsumoto et al. ... 365/185.23 |
| 6,101,126 | A | * | 8/2000 | Chung et al. .......... 365/185.23 |
| 6,160,735 | A | * | 12/2000 | Hirano .................. 365/185.18 |
| 6,166,969 | A | * | 12/2000 | Song et al. ............ 365/189.11 |
| 6,512,253 | B2 | | 1/2003 | Watanabe et al. |
| 6,621,735 | B2 | | 9/2003 | Nakamura et al. |

FOREIGN PATENT DOCUMENTS

JP 2000-91546 3/2000

* cited by examiner

*Primary Examiner*—Anh Phung
(74) *Attorney, Agent, or Firm*—Oblon, Spivak, McClelland, Maier & Neustadt, P.C.

(57) ABSTRACT

A level shifter circuit comprises a first output MIS transistor of a first conductivity, and a second output MIS transistor of a second conductivity type having a second threshold voltage. The former has a first threshold voltage, wherein the output voltage is positively fed back to a gate terminal and the power supply voltage is applied to a first terminal to generate a first voltage at a second terminal. In the latter, the first voltage is applied to a first terminal and a second voltage is applied to a gate terminal to control conduction to generate the output voltage at a second terminal. The first and second charge type MIS transistors and the discharge MIS transistor are connected between the first terminal and gate terminal of the second output MIS transistor to charge or discharge the potential of the gate terminal of the second output MIS transistor.

22 Claims, 11 Drawing Sheets

FIG. 6 for enable

FIG. 7 for disable

FIG. 10 for disable

FIG. 11 for enable

FIG. 14 for enable

FIG. 15 for disable

LEVEL SHIFTER CIRCUIT AND SEMICONDUCTOR MEMORY DEVICE USING SAME

CROSS-REFERENCE TO PRIOR APPLICATION

This application is based upon and claims the benefit of priority from the prior Japanese Patent Application No. 2005-5070, filed on Jan. 12, 2005, the entire content of which is incorporated herein by reference.

BACKGROUND OF THE INVENTION

1. Field of the Invention

This invention relates to a level shifter circuit which switches the amount of an output voltage to be output and to a semiconductor memory device including such a level shifter circuit in a row decoder circuit.

2. Description of the Related Art

Conventionally, an electrically rewritable EEPROM is known as one of the semiconductor memory devices. In particular, a NAND cell-type EEPROM in which each NAND cell block includes a plurality of memory cells connected in series is attracting attention as a device that can achieve a high degree of integration.

Each memory cell of a NAND cell-type EEPROM has a FET-MOS structure in which a floating gate (charge storage layer) and a control gate are stacked via an insulating film on a semiconductor substrate. A plurality of memory cells are connected in series, with adjacent cells sharing source/drain, to form a NAND cell. The NAND cell is connected to a bit line as a unit. Such NAND cells arranged in a matrix form a memory cell array. The memory cell array is integrally formed in a p-type semiconductor substrate or in a p-type well.

Each drain positioned at one end of the NAND cells connected in series in a column direction of the memory cell array is commonly connected via a select gate transistor to a bit line, while each source positioned at the other end is also connected via a select gate transistor to a common source line. The control gate of the memory transistor and the gate electrode of the select gate transistor are commonly connected as a control gate line (word line) and a select gate line, respectively, in the row direction of the memory cell array.

This NAND cell-type EEPROM operates as follows. Data programming operations mainly start from a memory cell which is the most remote from the bit line contact. First, when the data programming operation starts, according to write data, the bit line is given 0 V (for "0" data programming bit line) or a power supply voltage Vcc (for "1" data programming bit line), and the select gate line on the selected bit-line contact side is given Vcc. In this case, in the selected NAND cell connected to the "0" data programming bit line, its channel portion is fixed to 0 V via a select gate transistor. In the selected NAND cell connected to the "1" data programming bit line, on the other hand, its channel portion is charged via the select gate transistor up to [Vcc−Vtsg] (where Vtsg is the threshold voltage of the select gate transistor) and then enters a floating state. Subsequently, one control gate line in the selected NAND cell changes in potential from 0 V to Vpp (=20 V or so, which is a programming high voltage), while the other control gate line in the selected NAND cell changes in potential from 0 V to Vmg (=10 V or so, which is an intermediate voltage).

Because the selected NAND cell connected to the "0" data programming bit line has its channel portion fixed at 0 V, it has a large potential difference (=20 V or so) between its selected memory cell's control gate line (=Vpp potential) and its channel portion (=0 V), thus causing electrons to be injected from the channel portion to the floating gate. Accordingly, the threshold voltage of that selected memory cell shifts to the positive direction, thus completing programming of data "0".

The selected NAND cell connected to the "1" data programming bit line, on the other hand, has its channel portion in a floating state, so that the influence of the capacitive coupling between its control gate line and its channel portion raises the voltage of the control gate line (0 V>Vpp, Vmg), which in turn raises the potential of the channel portion from a [Vcc−Vtsg] potential to Vmch (=8 V or so) with that channel portion as held in the floating state. In this case, since the potential difference between the control gate line (=Vpp potential) and the channel portion (=Vmch) of the selected memory cell in the selected NAND cell is a relatively low value of 12 V or so, thus avoiding the electron injection. Therefore, the threshold voltage of the selected memory cell is held unchanged at the negative value.

Data erase is carried out to all of the memory cells in the selected NAND cell block at the same time. That is, 0 V is applied to all the control gate lines in the selected NAND cell block, while a high voltage of 20 V or so is applied to the bit lines, source lines, p-type well regions (or p-type semiconductor substrate), and the control gate lines and all the select gate lines in the non-selected NAND cell blocks. Thus, in all the memory cells in the selected NAND cell block, the electrons in the floating gate are emitted to the p-type well (or p-type semiconductor substrate), thus shifting the threshold voltage to the negative direction.

Data reading, on the other hand, is carried out by applying 0 V to the control gate line in the selected memory cell and a reading intermediate voltage Vread (4 V or so) to the control gate line and the select gate line of the other memory cells to detect whether a current flows through that selected memory cell.

As may be obvious from the above description, to write data into a NAND cell-type EEPROM, it is necessary to apply voltages higher than the power supply voltage, i.e., Vpp (20 V or so) to the selected control gate line in the selected block and Vmg (10 V or so) to the non-selected control gate line in that selected block.

To transfer such high voltages Vpp and Vmg to the memory cell, the conventional NAND-type EEPROM includes a row decoder circuit including a voltage conversion circuit which converts the power supply voltage to such high voltages (see, for example, U.S. Pat. No. 6,621,735). The voltage conversion circuit needs to include a PMOS transistor of a high withstand voltage.

SUMMARY OF THE INVENTION

A level shifter circuit according to an embodiment of this invention is a level shifter circuit which generates an output voltage according to input of an input voltage and switches an amount of the above described output voltage by switching a power supply voltage of the above described output voltage, comprising: a first output MIS transistor of a first conductivity and having a first threshold voltage, wherein the above described output voltage is positively fed back to a gate terminal and the above described power supply voltage is applied to a first terminal to generate a first voltage at a second terminal; A second output MIS transistor of a second conductivity type opposite to the above described first conductivity type having a second threshold voltage, wherein the above described first voltage is applied to a first terminal and a second voltage is applied to a gate terminal to control conduction to generate the above described output voltage at a second terminal; A first charge MIS transistor of the first conductivity type connected between the first terminal and gate terminal of the above described second output MIS transistor, the above described first charge MIS transistor having a third threshold voltage of the same sign as the above described first threshold voltage, and upon the above described input voltage being in a first state, becoming conductive to transfer the voltage of the first terminal of the above described second output MIS transistor to the gate terminal of said second output MIS transistor to keep the above described second output MIS transistor non-conductive, and upon the above described input voltage being in a second state, charging a potential of the gate terminal of the above described second output MIS transistor to a potential defined by an absolute value of the above described third threshold voltage and switching to a non-conductive state; A second charge MIS transistor of the first conductivity type connected between the first terminal and gate terminal of the above described second output MIS transistor, the above described second charge MIS transistor having a fourth threshold voltage of opposite sign to the above described first threshold voltage, and upon the above described first voltage being higher than the above described second voltage by the above described fourth threshold voltage, becoming conductive to charge the gate terminal of the above described second output MIS transistor; and A discharge MIS transistor of the first conductivity type connected between the first terminal and gate terminal of the above described second output MIS transistor, the above described discharge MIS transistor having a fifth threshold voltage whose absolute value is smaller than the above described fourth threshold voltage, and upon the above described first voltage being lower than the above described second voltage by the above described fifth threshold voltage, becoming conductive to discharge a charge of the gate terminal of the above described second output MIS transistor.

A semiconductor memory device according to another embodiment of this invention is a semiconductor memory device which includes a memory cell array with memory cells arranged in a matrix and a row decoder circuit selecting a word line of the above described memory cell array and transferring a voltage to the word line, wherein. The above described row decoder circuit includes a level shifter circuit with a configuration as described above which generates an output voltage according to input of an input voltage and switches an amount of the above described output voltage by switching a power supply voltage of the above described output voltage.

DETAILED DESCRIPTION OF THE INVENTION

Figure 1:
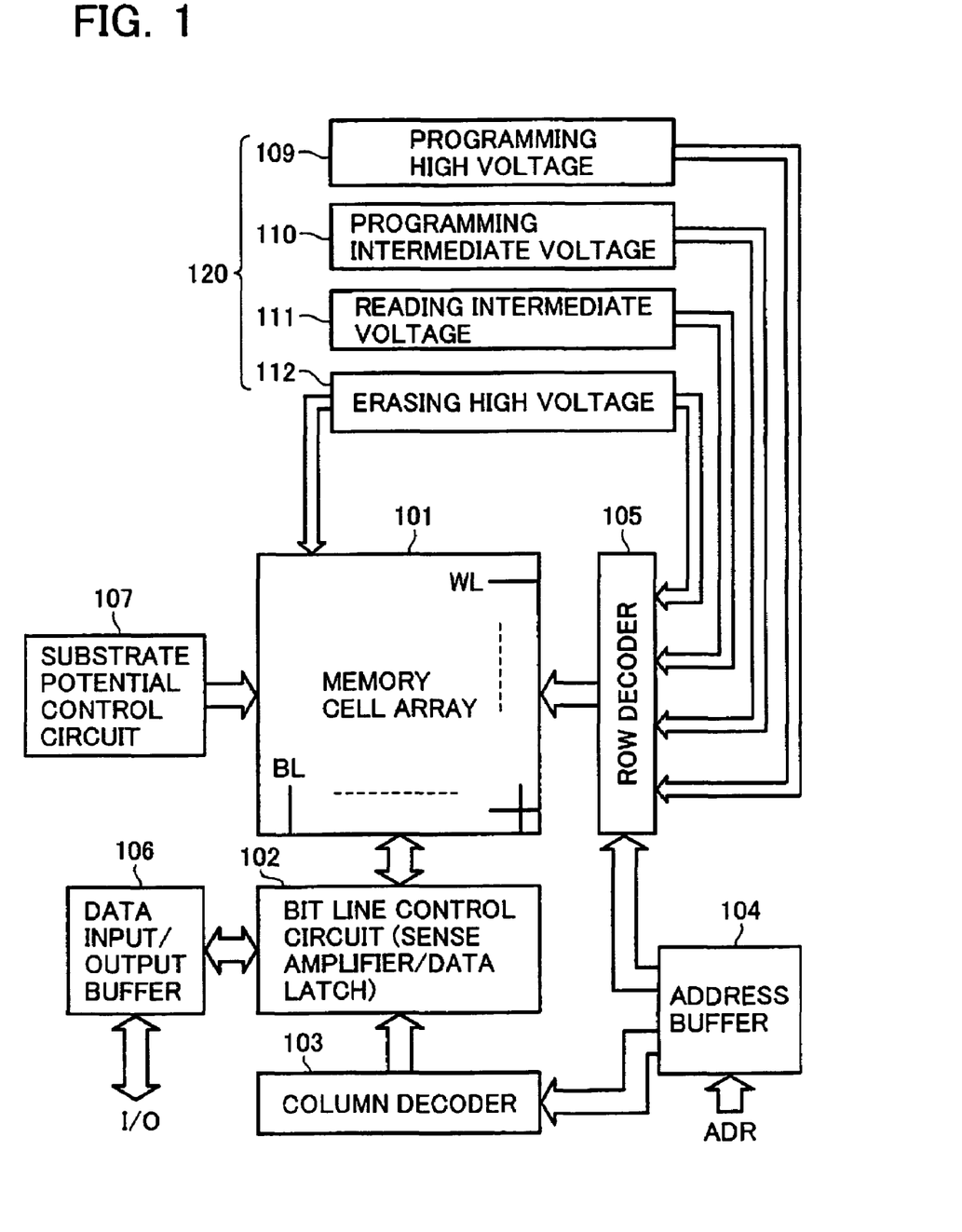
FIG. 1 is a block diagram of a schematic configuration of NAND-cell type EEPROM according to an embodiment of the present invention.

Embodiments of the present invention will be described below with referring to the appended drawings. FIG. 1 illustrates a semiconductor memory device according to an embodiment of the present invention and is a block diagram showing a schematic configuration of a NAND cell type EEPROM. To a memory cell array 101 is connected to a bit line control circuit (sense-amplifier/data latch) 102 for data programming, reading, reprogramming, and verify reading. This bit line control circuit 102 is connected to data input/output buffer 106 and receives as input an output from column decoder 103 which receives an address signal from address buffer 104.

Furthermore, to the above-mentioned memory cell array 101 is connected to row decoder 105 for controlling a control gate and a select gate, and substrate potential control circuit 107 for controlling a potential of a p-type silicon substrate (or p-type well region) in which this memory cell array 101 is formed. Four types of voltage generating circuits 120 are also provided as circuits which generate voltages necessary for operations such as programming and reading, whose voltages are provided to components such as the memory cell. More specifically, a programming high-voltage generating circuit 109 and a programming intermediate-voltage generating circuit 110 are provided for generating the programming high-voltage Vpp (20 V or so) and the intermediate-voltage Vmg (10 V or so), respectively, during the data programming operation. Further, a reading intermediate-voltage generating circuit 111 is provided for generating the reading intermediate-voltage Vread during the data reading operation. Moreover, an erasing high-voltage generating circuit 112 is provided for generating the erase high-voltage Vpp (20 V or so) during the erase operation.

The bit line control circuit 102 includes mainly CMOS flip-flops, which carry out a sense operation for latching write data or reading a bit line potential, a sense operation for verify reading after a programming operation, and latching rewrite data.

Figure 2A:
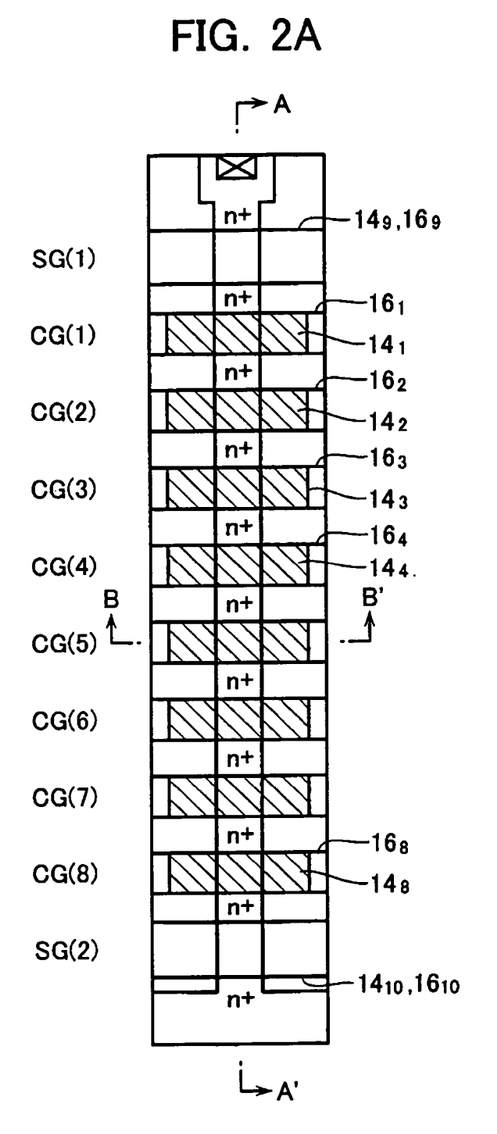
FIG. 2A is a plan view of one NAND-cell portion in memory cell array 101 in FIG. 1.
Figure 2B:
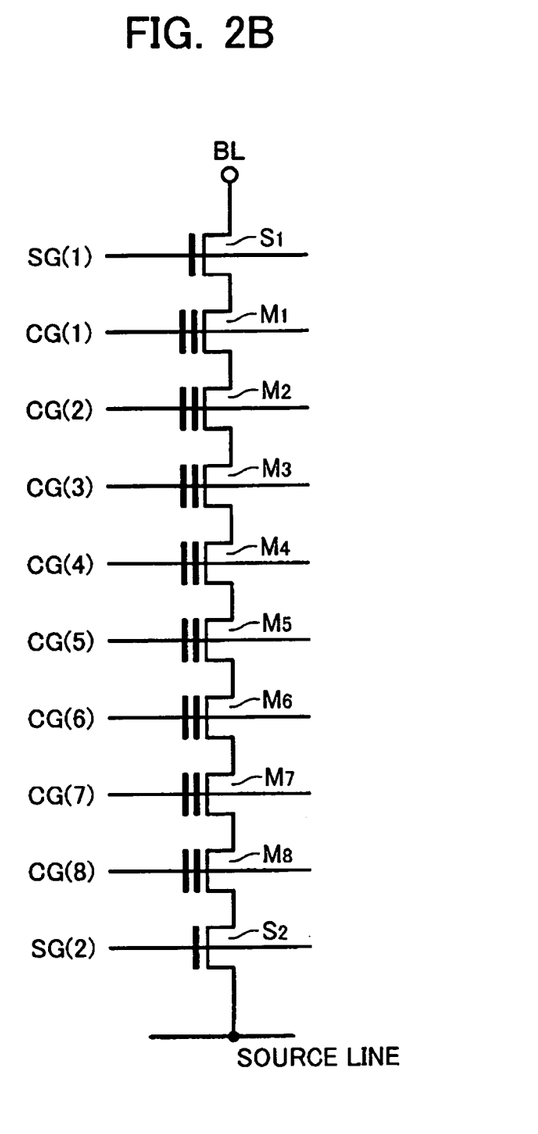
FIG. 2B is an equivalent circuit diagram of one NAND-cell portion in memory cell array 101 in FIG. 1.
Figure 3A:
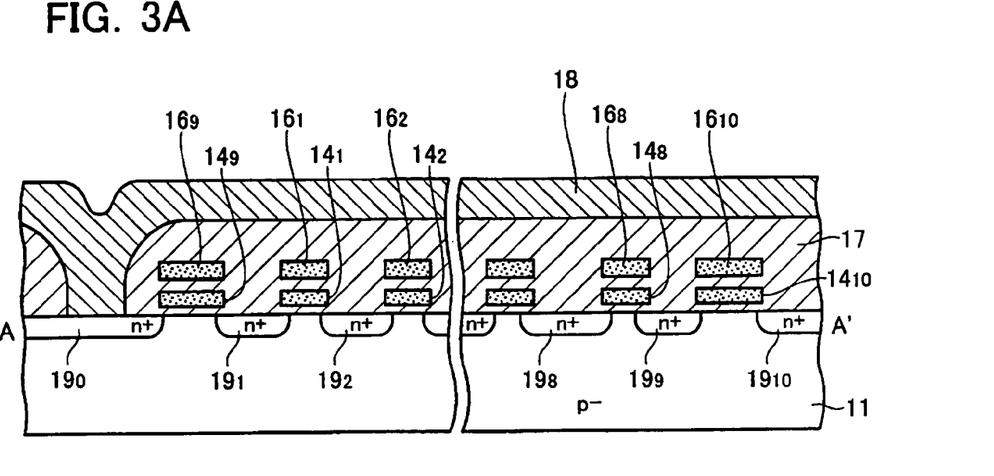
FIG. 3A is a cross sectional view taken along line A-A' in FIG. 2A.
Figure 3B:
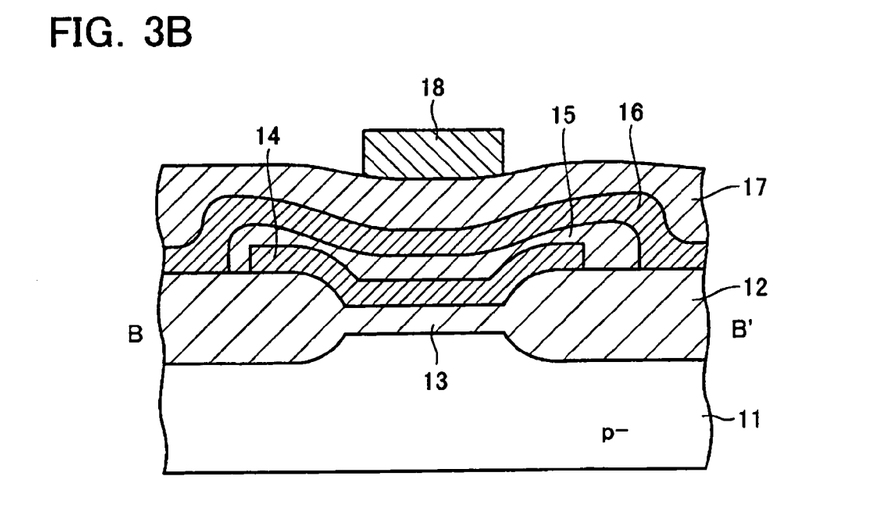
FIG. 3B is a cross sectional view taken along line B-B' in FIG. 2A.

FIGS. 2A and 2B are a plan view and an equivalent circuit diagram, respectively, of one NAND cell portion in the above-mentioned memory cell array 101. FIGS. 3A and 3B are cross-sectional views taken along lines A-A' and B-B', respectively, of FIG. 2A. On a p-type silicon substrate (or p-type well region) surrounded by an element isolating oxide film 12 is formed the memory cell array including a plurality of NAND cells. As can be seen from a look at one NAND cell, in this embodiment, eight memory cells M1 to M8, for example, are connected in series to form one NAND cell.

Memory cells M1 to M8 include floating gates 14 (141, 142, ..., 148) formed on the substrate 11 via gate insulating films 13. Control gates 16 (=word lines 161, 162, ..., 168) are formed on the floating gates 14 via insulating films 15. N-type diffusion layers 19 (190, 192, ..., 1910) which provide sources and drains of those memory cells are connected in such a manner that adjacent cells share a layer as a source and a drain.

On the drain and source sides of the NAND cell are formed a pair of select gates 149 and 169 and a pair of select gates 1410 and 1610, respectively, which are formed simultaneously with the memory cell floating gates and the control gates. The select gates provide select transistors S1 and S2. Oxide film 17 covers substrate 11 on which the elements are formed. Bit line 18 is provided on oxide film 17. The bit line 18 is connected to drain-side diffusion layer 19 at one end of the NAND cell. Control gates 16 for the NAND cells arranged in a row direction are provided commonly as gate lines CG(1), CG(2), ..., CG(8). Those control gates provide word lines. The select gate pair of 149 and 169 and of 1410 and 1610 are also sequentially provided as select gates SG(1) and SG(2), respectively, in a row direction.

Figure 4:
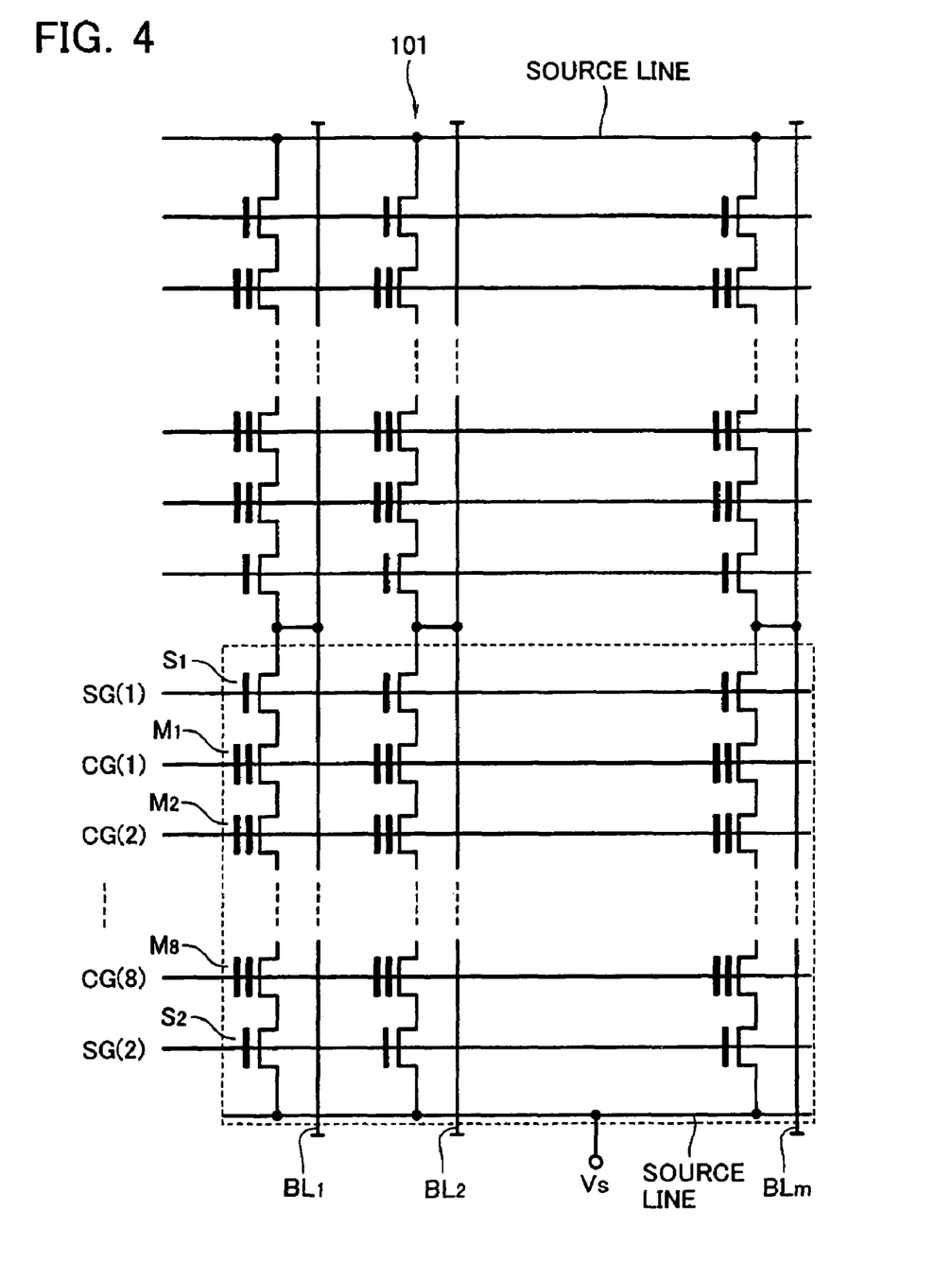
FIG. 4 shows an equivalent circuit of memory cell array 101 including NAND cells as shown in FIG. 2A and FIG. 2B that are arranged in a matrix.

FIG. 4 shows an equivalent circuit diagram of the memory cell array in which such NAND cells are arranged in a matrix. A group of NAND cells which shares the same word line or select line and is a region surrounded by the broken line in FIG. 4 is referred to as a block. During the usual reading or programming operation, only one of a plurality of blocks is selected (which is referred to as a selected block).

Figure 5:
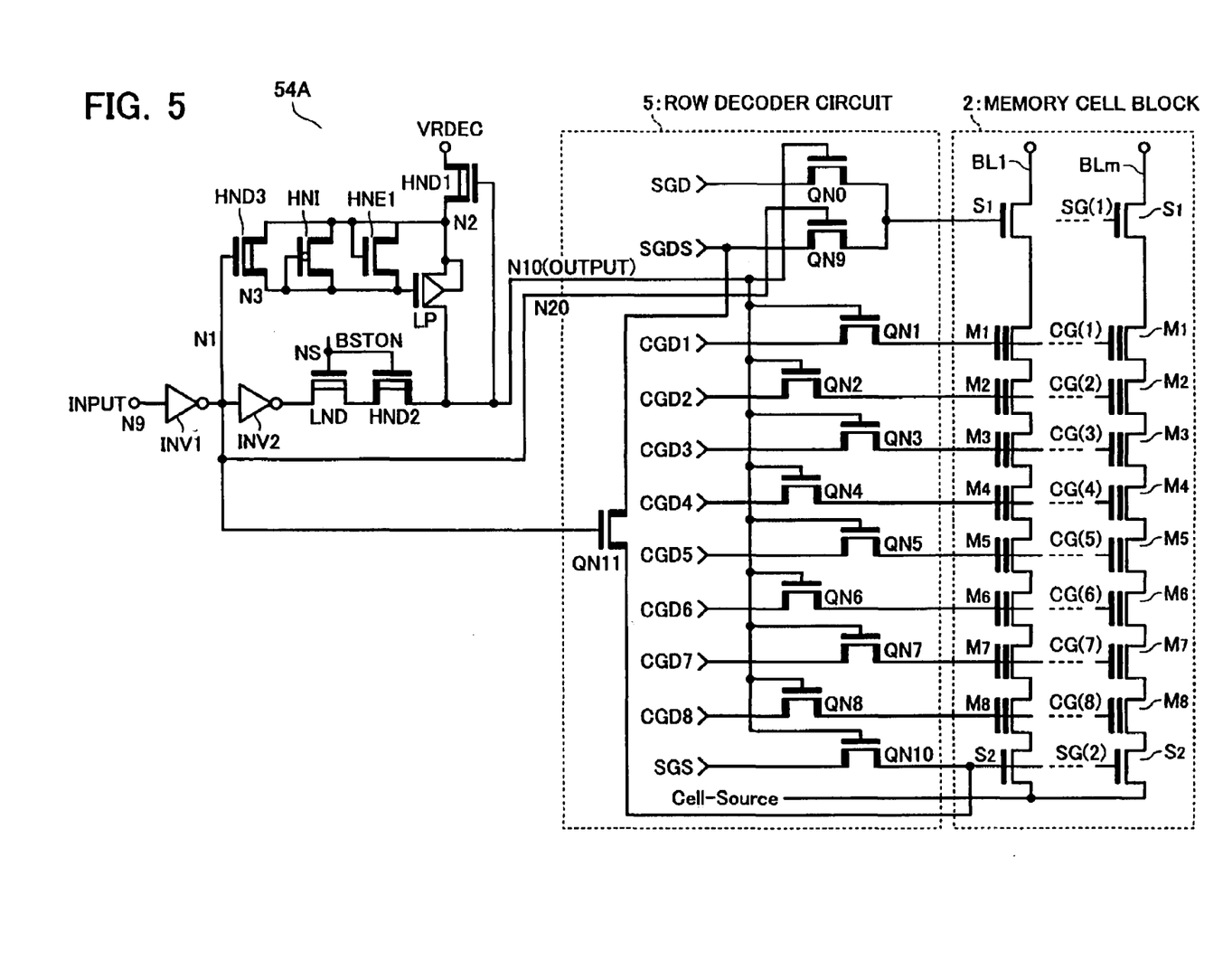
FIG. 5 shows a configuration example of row decoder 105 shown in FIG. 1, and a configuration example of level shifter circuit 54A contained in row decoder 105.

FIG. 5 shows a configuration example of row decoder 105. FIG. 5 shows row decoder circuit 5 included in row decoder 105, which circuit is arranged on one side of one memory cell block 2 in memory cell array 101. Row decoder circuit 5 includes transfer transistors QN0 to QN11 (with the threshold voltage of Vth(QN)) connected to control gate lines CG(1) to CG(8) and select gate lines SG(1) and SG(2). In the circuit in FIG. 5, transistors QN0 to QN11 connected to control gate lines CG(1) to CG(8) and select gate lines SG(1) and SG(2) are all of the n-channel type. Transistors QN1 to QN8 connect to control gates CG(1) to CG(8), respectively, with one transistor per one control gate line.

Specifically, current paths of NMOS transistors QN1 to QN8 are connected between control gate lines CG(1) to CG(8) and their signal input nodes CGD1 to CGD8, respectively. Furthermore, current paths of NMOS transistors QN0 and QN9 are connected between select gate line SG(1) and its signal input nodes SGD and SGDS, respectively. Further, current paths of NMOS transistors QN10 and QN11 are connected between select gate line SG(2) and its signal input nodes SGS and SGDS, respectively.

The circuit in FIG. 5 also includes level shifter circuit 54A which sets the gate voltages of NMOS transistors QN0 to QN11 and switches the voltages of control gate lines CG(1) to CG(8) and select gate lines SG(1) and SG(2). Level shifter circuit 54A outputs different amounts of output voltage OUTPUT to output node N10 according to the input voltage INPUT and control signal BSTON. If memory cell block 2 is selected, input voltage INPUT is power supply voltage Vdd. If not, input voltage INPUT is reference voltage Vss. Inverted signal /INPUT of input voltage INPUT is input to node N20, i.e., the gates of transistor QN9 and QN11. This can cause only one of transfer transistors QN0 and QN9 conductive, and also cause only one of transfer transistors QN11 and QN9 conductive.

Note that, in FIG. 5, one of n-channel MOS transistors QN0 to QN11 may be replaced by one transfer gate formed for one control gate or select gate, which gate includes p-channel type MOS transistor and n-channel type MOS transistor connected in parallel.

Level shifter circuit 54A includes, between output node N10 and power supply node VRDEC, transistor HND1 and transistor LP connected in series at node N2 (the source of transistor HND1). Transistor HND1 is a depression type (D-type) N-channel MOS transistor with high withstand voltage and has a negative threshold voltage Vth (HND1). Transistor LP is an enhancement type (E-type) P-channel MOS transistor having a negative threshold voltage Vth (LP).

Transistor HND1 has the drain that is connected to power supply node VRDEC, the source that is connected to the source of transistor LP at node N2, and the gate to which the output voltage OUTPUT is positively fed back. Because of the high voltage applied between the source and drain, transistor HND1 needs to have the high withstand voltage so that it has a thick gate-insulating film. Further, transistor HND1 has the negative threshold voltage Vth (HND1) (D-type) so that, when the high voltage Vpp is applied to power supply node VRDEC and gate, transistor HND1 can transfer Vpp to node N2.

For the reason described below, transistor LP may have the low withstand voltage and have a gate-insulating film as thin as inverter circuits INV1 and INV2 and the like as described below. Note that the substrate (N-type well) of transistor LP is short-circuited to the source so that high voltage Vpp can be applied to it.

At the stage where the input voltage INPUT is the reference voltage Vss, the potential difference between the gate and drain of transistor LP is |Vth (HND1)|. The gate insulating film of transistor LP can thus be formed such that its withstand voltage satisfies the above potential difference. Because of the potential difference between the gate and source being 0V and the Vth (LP) being negative, transistor LP is not conductive.

In addition, as described below, Vth (LP) is thus set to satisfy the following equation (1), so that the output voltage OUTPUT increases when power supply node VRDEC increases from Vdd to Vpp.

$$VN2\ (Vdd,\ Vpp) - |Vth\ (HND1)| > |Vth\ (LP)| \tag{1}$$

Note that VN2 (Vdd, Vpp) is the voltage which transistor HND2 transfers to node N2 when the gate of transistor HND1 (output voltage OUTPUT) is Vdd and power supply node VRDEC is Vpp.

Level shifter circuit 54A also includes, between node N9 to which input voltage INPUT is input and output node N10, the following components connected in series: inverter circuits INV1 and INV2, N-channel MOS transistor LND having a low withstand voltage (i.e., having the same-thickness gate insulating film as the transistors used in inverter circuits INV1 and INV2) and of D-type (i.e., having the negative threshold voltage Vth (LND)), and N-channel MOS transistor HND2 with the high withstand voltage and of D-type (i.e., having the negative threshold voltage Vth (HND2)). Transistor LND and transistor HND2 receive control signal BSTON applied to their gates, and totally form a switching circuit.

Between node N2 and node N3 which is the gate of transistor LP, three transistors HND3, HNI, and HNE1 are connected in parallel. Transistor HND3 is an N-channel MOS transistor with the high withstand voltage and of D-type (i.e., having the negative threshold voltage Vth (HND3)). Transistor HND3 has the gate to which output node N1 of inverter circuit INV1 is connected and to which inverted signal /INPUT of input voltage INPUT is input.

Therefore, when the input voltage INPUT is the reference voltage Vss, transistor HND3 becomes conductive to keep nodes N2 and N3 at the same potential, which makes transistor LP non-conductive. On the other hand, when the input voltage INPUT is the power supply voltage Vdd, transistor HND3 charges the gate of transistor LP (node N3) up to the absolute value of the threshold voltage Vth (HND3) and then switches to the non-conductive state.

Transistor HNI is an N-channel MOS transistor with the high withstand voltage and of intrinsic type (I-type, i.e., having the almost zero threshold voltage Vth (HNI)). Transistor HNI has the gate that is short-circuited to node N3. At the stage where the output voltage OUTPUT decreases, transistor HNI becomes conductive when the potential of node N2 is lower than the potential of node N3 by the threshold voltage Vth (HNI). Transistor HNI then transfers the potential of node N3 to node N2 to keep the potential difference between node N2 and N3 at about threshold voltage Vth (HNI).

The threshold d voltage Vth (HNI) is preferably a value near zero. The reason is described below. At the stage where the output voltage OUTPUT decreases, the junction of output node N10 (drain) and node N2 (substrate, source) of transistor LP is discharged at the forward state. A lower threshold voltage Vth (HNI) can split such a current to transistor HNI more early. This can reduce the excess current through transistor LP. The optimized structure of the well of transistor LP can also reduce the discharged current of transistor LP in the forward state.

Transistor HNE1 is an N-channel MOS transistor with the high withstand voltage and of E-type (i.e., having the positive threshold voltage Vth (HNE1)). Transistor HNE1 has the gate that is short-circuited to node N2. At the stage where output voltage OUTPUT increases, transistor HNE1 becomes conductive and can transfer the potential of node N2 to node N3 to keep the potential of node N2 higher than the potential of node N3 by the threshold voltage Vth (HNE1). This can keep the large potential difference between the source and gate of transistor LP. To keep transistor LP conductive, the threshold voltage Vth (HNE1) is set to satisfy the following equation 2.

$$Vth\ (HNE1) > |Vth\ (LP)| \quad (2)$$

Figure 6:
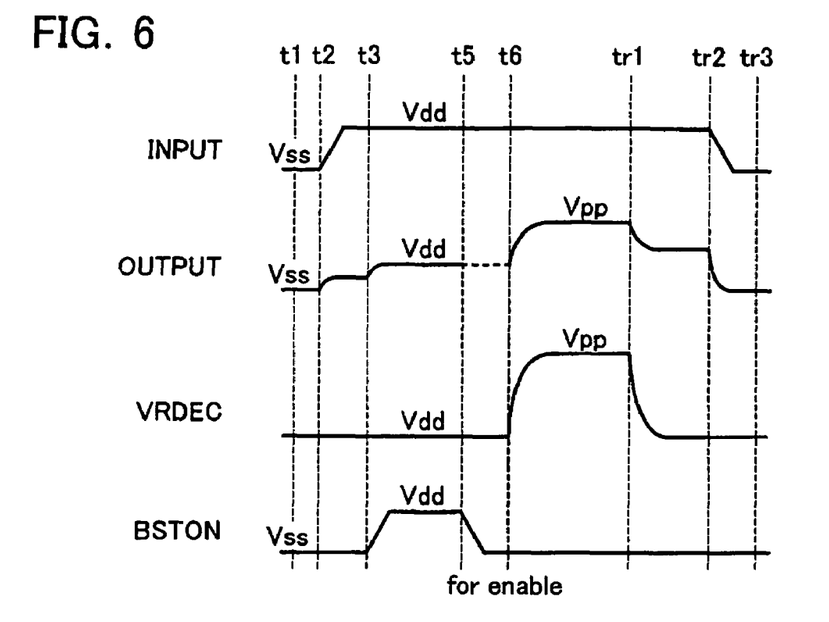
FIG. 6 illustrates the operation of level shifter circuit 54A in FIG. 5.

Referring now to FIG. 6, a description is given of the operation of level shifter circuit 54A of the NAND cell type EEPROM. The description will be given here with the assumption that the input voltage INPUT increases from the reference voltage Vss to the power supply voltage Vdd at time t2 and then remains at Vdd until time tr2, and decreases to Vss again at time tr2.

Another assumption is made that the control signal BSTON increases from Vss to Vdd at time t3 and decreases to Vss again at time t5. Another assumption is also made that the power supply node VRDEC increases from Vdd to Vpp at time t6 and decreases to Vdd again at time tr1.

(1) Time t1 to t2

In time t=t1 to t2, the input voltage INPUT is the reference voltage Vss. Transistor LND and HND2 are conductive because they are D-type. Input voltage INPUT are thus transferred from node N9 to provide the output voltage OUTPUT of Vss. The output voltage OUTPUT (=Vss) makes transistor HND1 conductive. Transistor HND1 charges node N2 up to |Vth (HND1)| and then becomes non-conductive (cut-off).

The voltage of node N1 that is the power supply voltage Vdd makes transistor HND3 conductive. This makes node N3 at the same potential as node N2 and keeps node N3 and node N2 at (|Vth (HND1)|). Transistor LP is non-conductive because it has the negative threshold voltage Vth (LP) as described above. In this way, in time t1 to t2, the output voltage OUTPUT remains at Vss. Note that transistors HNI and HNE1 are non-conductive because conductive transistor HND3 makes nodes N2 and N3 at the same potential.

(2) Time t2 to t3

The input voltage INPUT increases to Vdd to increase the output voltage OUTPUT. The control signal BSTON remains, however, at Vss, so that the increase of the output voltage OUTPUT to the absolute value |Vth (LND)| of the threshold voltage of transistor LND switches transistors LND and HND2 from the conductive to the non-conductive state. The output voltage OUTPUT thus stops the increase at |Vth (LND)|.

Such an increase of the output voltage OUTPUT (0->(|Vth (LND)|)) makes the transistor HND1 conductive again. Node N2 charged up to |Vth (HND1)|+|Vth (LND)| makes transistor HND1 non-conductive. At the same time, the voltage of node N1 is Vss, so that transistor HND3 charges node N3 up to |Vth (HND3)| and then becomes non-conductive. Node N2 and N3 at the potential as mentioned above make transistors HNI and HNE1 non-conductive. In this way, in time t2 to t3, the output voltage OUTPUT converges to |Vth (LND)|

(3) Time t3 to t5

The control signal BSTON increases from Vss to Vdd to increase the output voltage OUTPUT to Vdd. Such an output voltage OUTPUT (Vdd) makes transistor HND1 conductive again, which increases node N2 up to Vdd.

Although Transistors HND3, HNI, and HNE1 remain non-conductive, transistor LP becomes conductive due to the increase of node N2 up to Vdd. The positive-feedback loop formed by transistors HND1 and LP increases the output voltage OUTPUT up to Vdd.

(4) Time t5 to t6

The control signal BSTON returns to Vss to make transistors LND and HND2 non-conductive. The output terminal of the output voltage OUTPUT (the drain of transistor LP) is thus made in a floating state. The output voltage OUTPUT at this point is Vdd, which makes transistor HND1 conductive and keeps the potentials of node N2 and N3 at Vdd and |Vth (HND3)|, respectively (transistors HND3, HNI, and HNE1 remain non-conductive), so that transistor LP also keeps conductive. During this time period, therefore, the positive-feedback loop formed by transistors LP and HND1 keeps the output voltage OUTPUT at Vdd.

(5) Time t6 to tr1

The voltage of power-supply node VRDEC increases from Vdd to Vpp to increase the potential of node N2 up to Vpp through transistor HND1 which remains conductive. Transistor LP also remains conductive to increase the output voltage OUTPUT up to Vpp. During the increase, when the potential of node N2 increases to make the potential difference between node N2 and N3 equal to |Vth (HNE1)|, transistor HNE1 becomes conductive to increase the potential of node N3 up to Vpp−|Vth (HNE1)|. The potential difference between node N2 and N3 remains at |Vth (HNE1) |. There is thus no problem with the low withstand voltage of transistor LP.

(6) Time tr1 to tr2

As the voltage of power supply node VRDEC decreases from Vpp to Vdd, the potential of node N2 decreases from Vpp to Vdd accordingly. If the potential of node N2 is lower than the potential of node N3 by the threshold voltage of transistor HNI|Vth (HNI)| or more, transistor HNI becomes conductive to start to discharge a charge of node N3. Also during this time period, therefore, the potential difference between node N2 and N3 remains at about |Vth (HNI)|. There is thus no problem with the low withstand voltage of transistor LP.

The output voltage OUTPUT is discharged through transistor LP. Transistor LP switches from the conductive to the non-conductive state at the point when the difference between the node N3's voltage and the drain voltage, i.e., the output voltage OUTPUT, equals |Vth (LP)|, i.e., when the output voltage OUTPUT is Vdd+|Vth (HNI)|+|Vth (LP)|.

(7) Time tr2 to tr3

The input voltage INPUT decreases to Vss to make the output voltage OUTPUT discharged down to Vss through transistors LND and HND2 by inverter circuit INV2. This provides the return (recovery) of level shifter circuit 54A to the state in time t1 to t2.

Figure 7:
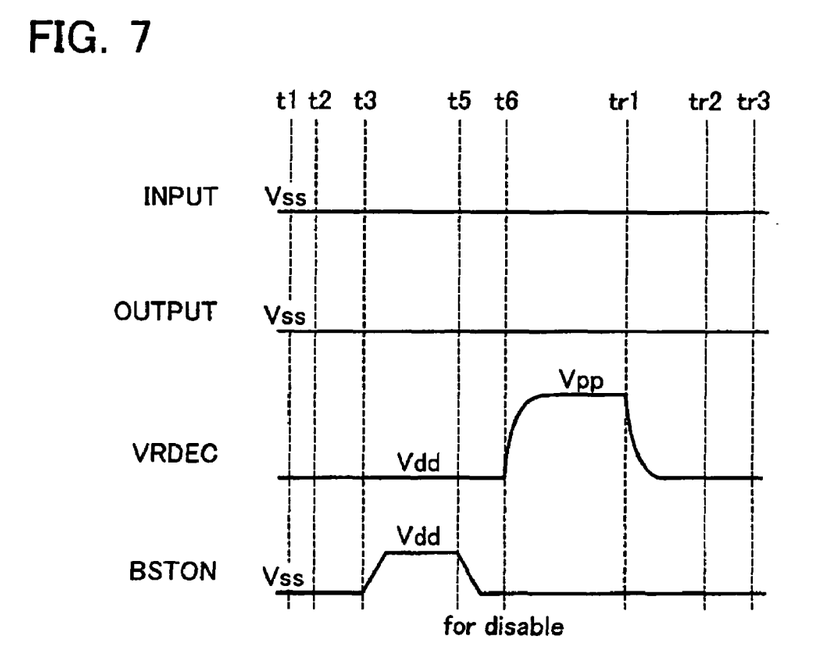
FIG. 7 illustrates the operation of level shifter circuit 54A in FIG. 5.

Note that, as shown in FIG. 7, the input voltage INPUT that remains at Vss also keeps the output voltage OUTPUT at Vss, regardless of the voltage of power supply node VRDEC and the control signal BSTON. Node N1 that remains at Vdd keeps transistor HND3 conductive, which keeps nodes N2 and N3 at the same potential (|Vth (HND1) |). Also in this case, there is no high-potential difference among each terminal of transistor LP (gate, source, drain, and substrate). There is thus no problem with transistor LP of the low withstand voltage.

As described above, the level shifter circuit according to this embodiment can keep the potential difference between nodes N2 and N3 at the same potential or at about the threshold voltage of transistor HNI or HNE1. There is thus no problem with the low withstand voltage of transistor LP.

Figure 8:
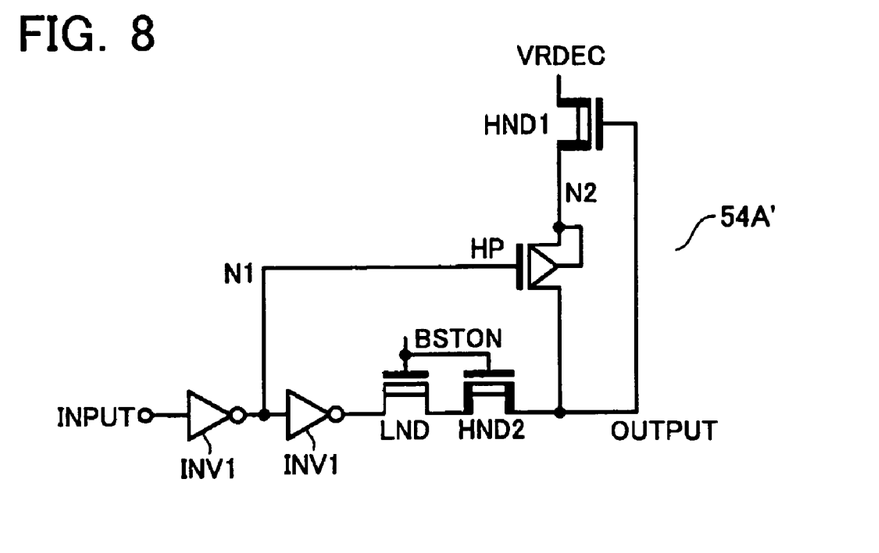
FIG. 8 shows a configuration of the level shifter circuit 54A' with high withstand voltage transistors.
Figure 9:
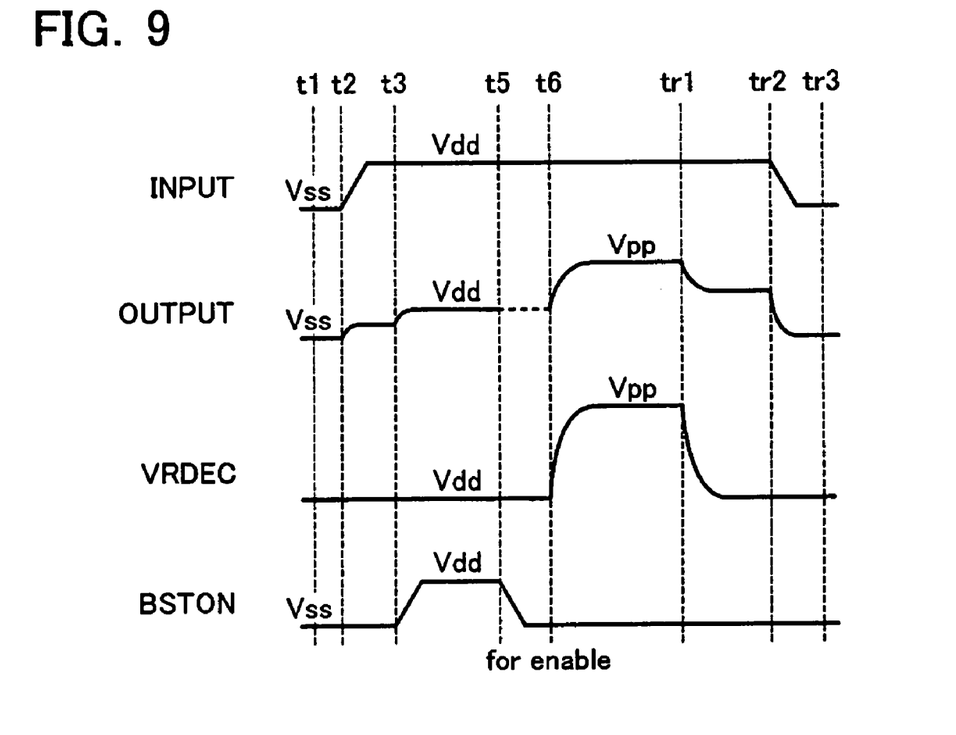
FIG. 9 illustrates the operation of level shifter circuit 54A' in FIG. 8.
Figure 10:
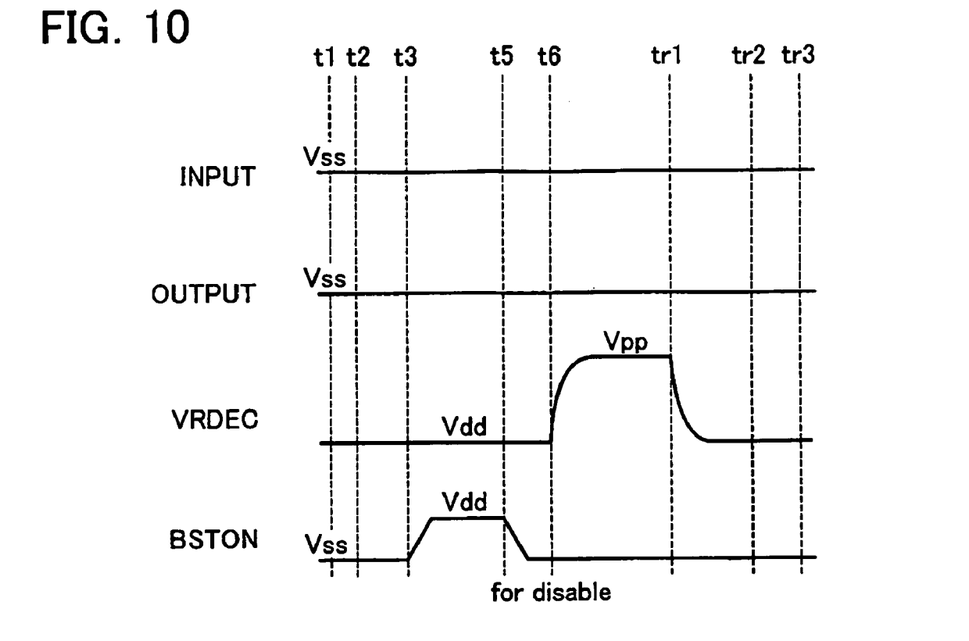
FIG. 10 illustrates the operation of level shifter circuit 54A' in FIG. 8.

FIG. 8 shows a configuration example of the level shifter circuit 54A' with high withstand voltage. FIG. 9 and FIG. 10 show the voltage change of each component during the operation (FIG. 9 shows the case where the input voltage INPUT is switched from Vss to Vdd, and FIG. 10 shows the case where the input voltage INPUT is held at Vss). In this circuit, transistors HND3, HNE1, and HNI are not provided, and output node N1 of inverter circuit INV1 directly connects to the gate of transistor HP which is connected in series with transistor HND1. This provides the higher potential difference between nodes N1 and N2, which difference is particularly Vpp in time t6 to tr1 (see FIG. 8). Transistor HP thus needs to have the higher withstand voltage. To provide the higher withstand voltage, the gate insulating film needs to be thicker than transistors such as inverter circuits INV1 and INV2. This increases the threshold voltage of transistor HP unless the channel implantation is performed. The power-supply voltage Vdd higher than the threshold voltage can operate the level shifter circuit as shown in FIG. 9 and FIG. 10. The lower power-supply voltage Vdd, however, may make it difficult to control the conductive state of transistor HP, because of the higher threshold voltage of transistor HP.

Figure 11:
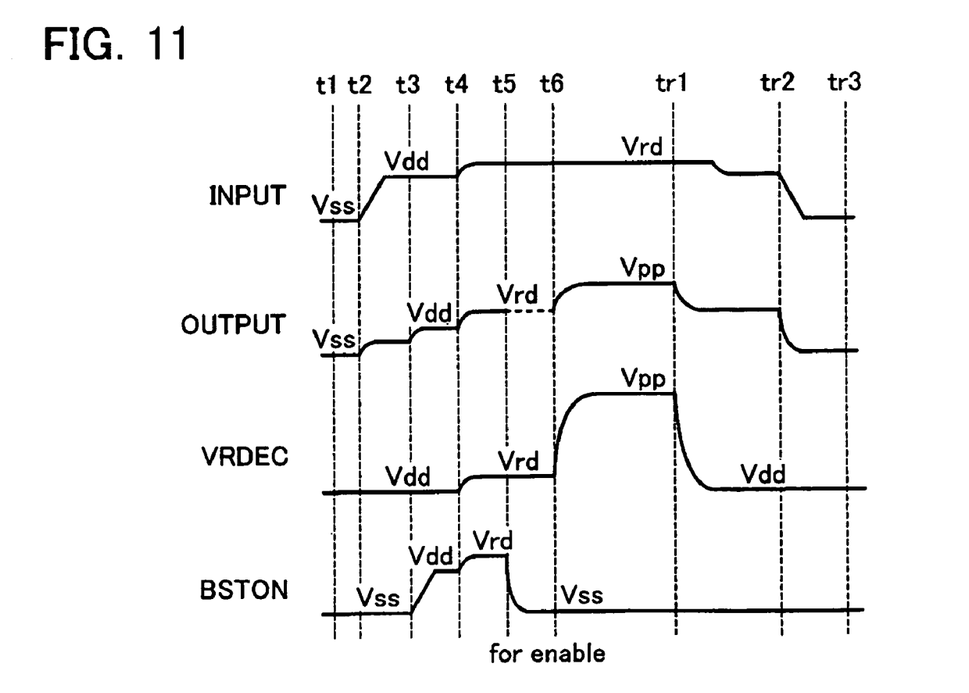
FIG. 11 illustrates another example of the operation of level shifter circuit 54A' in FIG. 8.
Figure 12:
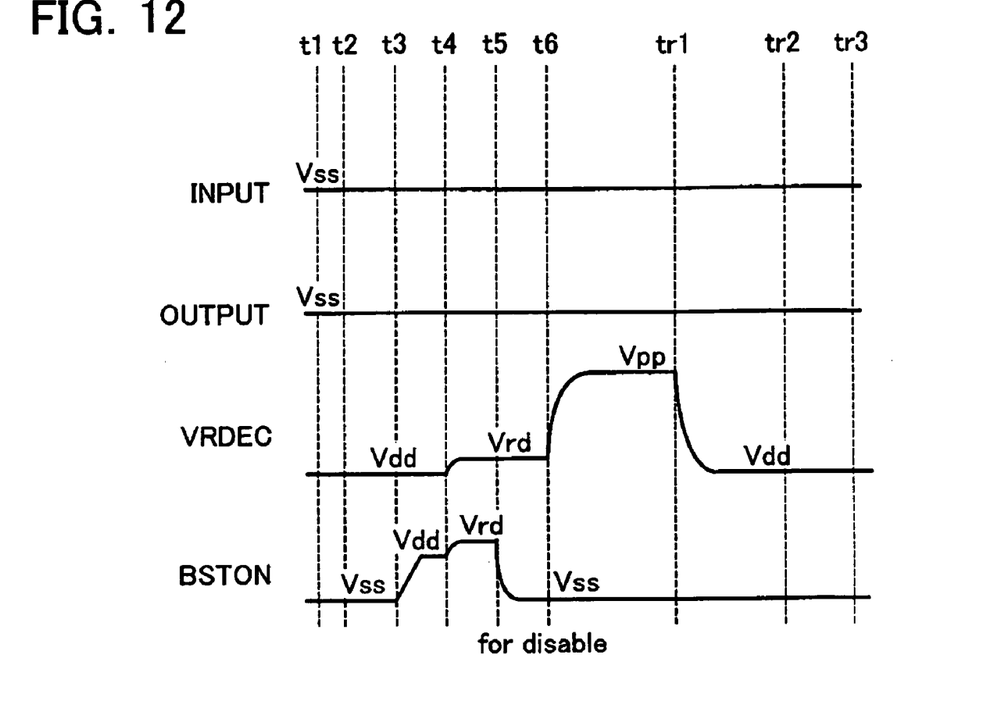
FIG. 12 illustrates another example of the operation of level shifter circuit 54A' in FIG. 8.

Alternatively, as shown in FIG. 11 and FIG. 12, a voltage pump circuit may be provided to pump up the control signal BSTON from Vdd to Vrd to satisfy the operation condition of transistor HP. In this case, however, the large area of the voltage pump circuit may cause a large total area of level shifter circuit 54A'. The voltage pump circuit may also decrease the operation speed.

In contrast, the above-described embodiment of the present invention includes transistors HND3, HNI and HNE1 between nodes N2 and N3, which transistors become conductive or non-conductive according to the increase or decrease of the output voltage OUTPUT, thereby preventing the high potential difference among each terminal of transistor LP. There is thus no need for transistor LP of the high withstand voltage. In addition, the increased area due to these three transistors is much lower than the increased area due to the additional voltage pump circuit, thereby providing less circuit area.

Figure 13:
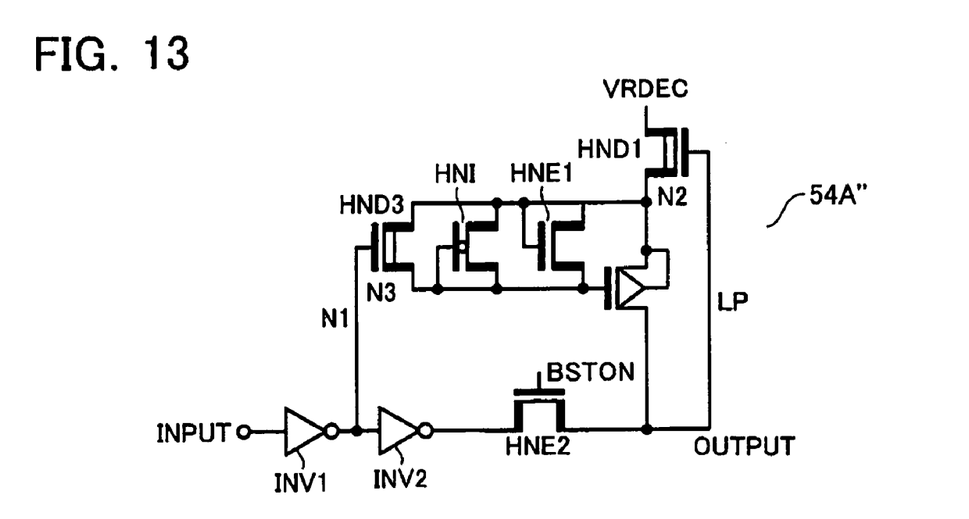
FIG. 13 shows a configuration of level shifter circuit 54A" according to the second embodiment of the present invention.
Figure 14:
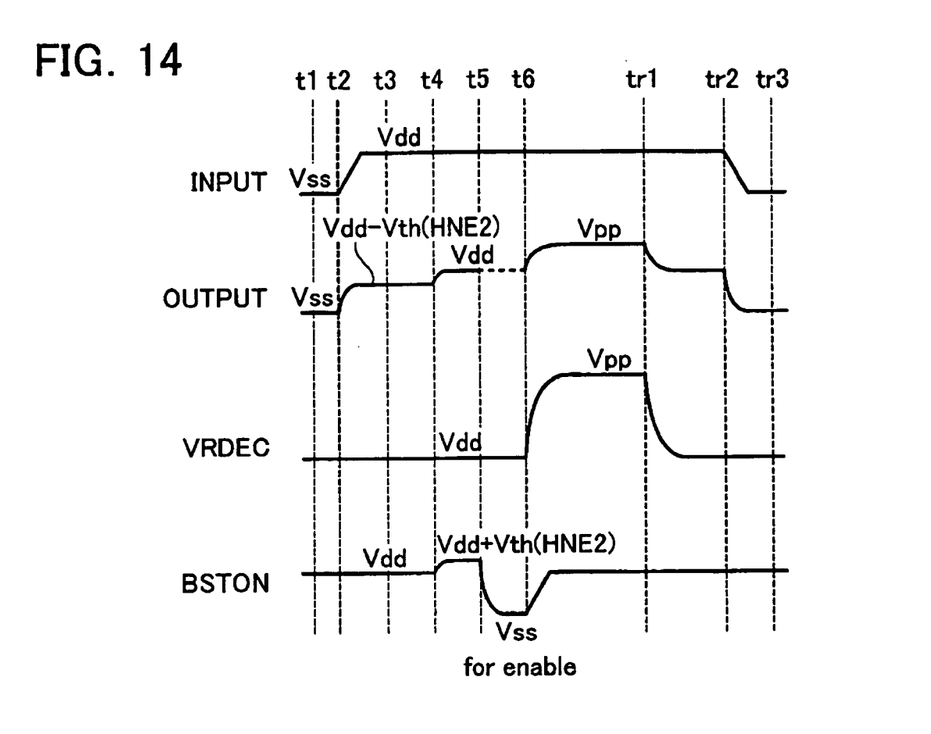
FIG. 14 illustrates the operation of level shifter circuit 54A" in FIG. 13.
Figure 15:
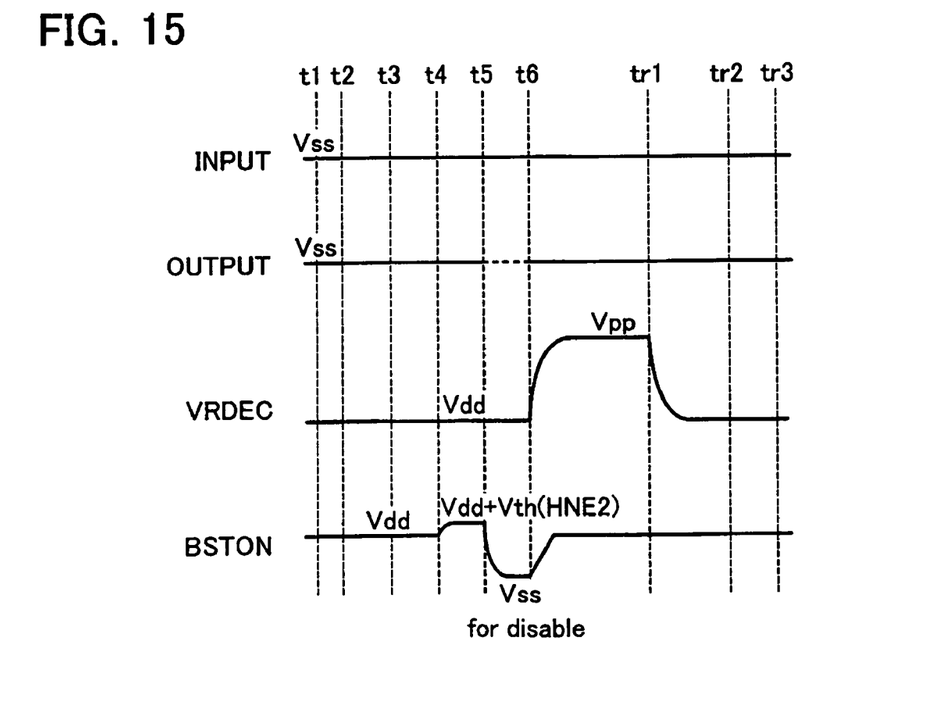
FIG. 15 illustrates the operation of level shifter circuit 54A" in FIG. 13.

FIG. 13 shows voltage conversion circuit 54A" according to the second embodiment of the present invention. FIG. 14 and FIG. 15 show the operation of the circuit 54A" (FIG. 14 shows the case where the input voltage INPUT is switched from Vss to Vdd, and FIG. 15 shows the case where the input voltage INPUT is held at Vss). In this embodiment, the transistor included in the level shifter circuit is only N-channel MOS transistor HNE2 (threshold voltage Vth (HNE2)) with the high withstand voltage and E-type. The control signal BSTON applied to the gate of transistor HNE2 is typically Vdd and controlled to increase from Vdd to Vdd+ Vth (HNE2) at time t4 by the operation of a not-shown voltage pump circuit, and decrease to Vss at time t5, and return to Vdd again at time t6.

As shown in FIG. 14, therefore, even when the input voltage INPUT increases to Vdd at time t2, the output voltage OUTPUT increases only up to Vdd−Vth (HNE2) because of the high threshold voltage Vth (HNE2) of transistor HNE2. In this embodiment, a voltage pump circuit (not shown) is thus operated to additionally increase the control signal BSTON up to Vdd+Vth (HNE2) at time t4, thereby increasing the output voltage OUTPUT from Vdd− Vth (HNE2) to Vdd. The control signal BSTON then decreases to Vss at time t5 because of the cutoff of transistor HNE2, and returns to Vdd at time t6.

Circuit 54A" in the second embodiment needs only one transistor HNE2 included in the switching circuit. Instead, the voltage pump circuit (not shown) is needed. The voltage pump circuit has, however, to increase the control signal BSTON by only about the threshold voltage Vth (HNE2) of transistor HNE2, so that a large voltage pump circuit is not needed and the circuit area of level shifter circuit 54A" is kept smaller than conventional ones. The threshold voltage Vth (HNE2) can be adjusted to eliminate the voltage pump circuit.

Figure 16:
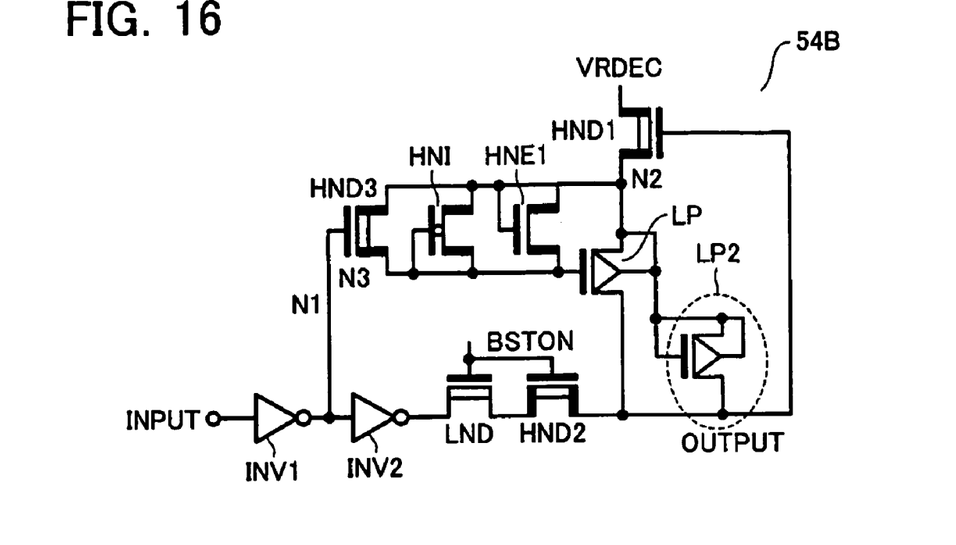
FIG. 16 shows a configuration of level shifter circuit 54B according to the third embodiment of the present invention.
Figure 17:
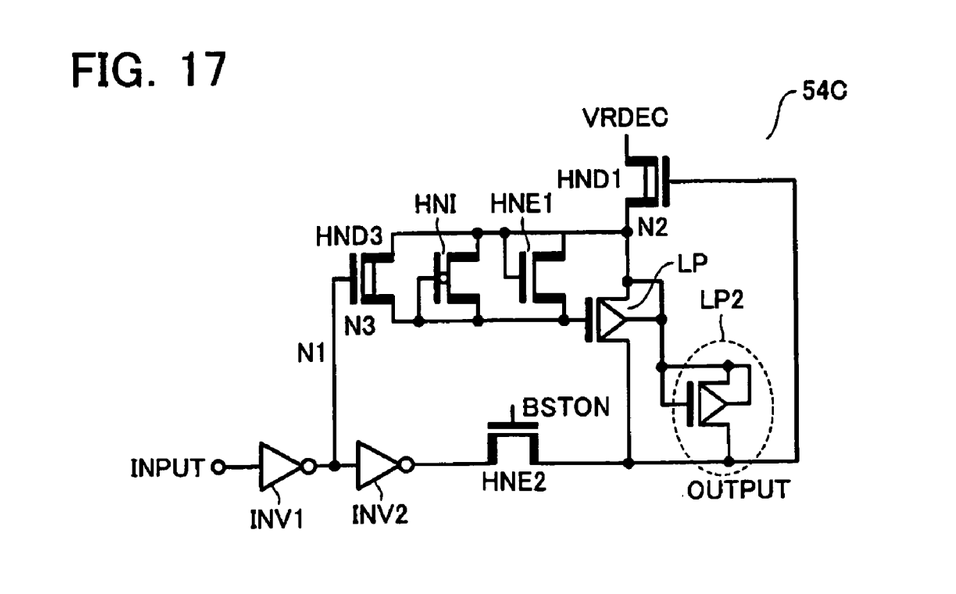
FIG. 17 shows a configuration of level shifter circuit 54C according to the third embodiment of the present invention.

FIG. 16 shows voltage conversion circuit 54B according to the third embodiment of the present invention. The third embodiment differs from the first embodiment in that discharge transistor LP2 of P-channel is formed in parallel with transistor LP (i.e., between the drain side of transistor LP (the output terminal of the output voltage OUTPUT) and node N2) to ease the excess current due to the junction of transistor LP being in the forward biased state at the stage where the output voltage OUTPUT decreases. Transistor LP2 can ease, together with transistor HNI, the excess current of transistor LP. Other features are the same as in the first embodiment. FIG. 17 shows voltage conversion circuit 54C including voltage conversion circuit 54A" according to the second embodiment of the present invention plus the above-described transistor LP2.

While the present invention has been described with reference to particular embodiments thereof, it is not limited to those embodiments, and various modifications, additions, and substitutions and the like might be made without departing from the spirit of the present invention. For example, while the above-described embodiments have been described with reference to NAND cell type EEPROM, the present invention can also widely apply to other semiconductor memory devices, such as NOR type, AND type, DINOR type, and 3 tr-NAND type, which need to switch the amount of voltage before supplying it to the memory cell and row decoder and the like.

What is claimed is:

1. A level shifter circuit which generates an output voltage according to input of an input voltage and switches an amount of said output voltage by switching a power supply voltage of said output voltage, comprising:
    a first output MIS transistor of a first conductivity having a first threshold voltage, wherein said output voltage is positively fed back to a gate terminal and said power supply voltage is applied to a first terminal to generate a first voltage at a second terminal;
    a second output MIS transistor of a second conductivity type opposite to said first conductivity type having a second threshold voltage, wherein said first voltage is applied to a first terminal and a second voltage is applied to a gate terminal to control conduction to generate said output voltage at a second terminal;
    a first charge MIS transistor of the first conductivity type connected between the first terminal and gate terminal of said second output MIS transistor, said first charge MIS transistor having a third threshold voltage of the same sign as said first threshold voltage, and upon said input voltage being in a first state, becoming conductive to transfer the voltage of the first terminal of said second output MIS transistor to the gate terminal of said second output MIS transistor to keep said second output MIS transistor non-conductive, and upon said input voltage being in a second state, charging a potential of the gate terminal of said second output MIS transistor to a potential defined by an absolute value of said third threshold voltage and switching to a non-conductive state;
    a second charge MIS transistor of the first conductivity type connected between the first terminal and gate terminal of said second output MIS transistor, said second charge MIS transistor having a fourth threshold voltage of opposite sign to said first threshold voltage, and upon said first voltage being higher than said second voltage by said fourth threshold voltage, becoming conductive to charge the gate terminal of said second output MIS transistor; and
    a discharge MIS transistor of the first conductivity type connected between the first terminal and gate terminal of said second output MIS transistor, said discharge MIS transistor having a fifth threshold voltage whose absolute value is smaller than said fourth threshold voltage, and upon said first voltage being lower than said second voltage by said fifth threshold voltage, becoming conductive to discharge a charge of the gate terminal of said second output MIS transistor.

2. A level shifter circuit according to claim 1, comprising an inverter circuit which outputs an inverted signal by inverting said input voltage, wherein at least said second output MIS transistor has the same thickness of a gate insulating film as an MIS transistor included in said inverter circuit.

3. A level shifter circuit according to claim 1, comprising an inverter circuit which outputs an inverted signal by inverting said input voltage, wherein said first charge MIS transistor receives said inverted signal applied to its gate terminal.

4. A level shifter circuit according to claim 3, wherein said first charge MIS transistor is an N-channel MIS transistor of a depression type having a negative threshold voltage.

5. A level shifter circuit according to claim 1, wherein said second charge MIS transistor has the gate terminal which is short-circuited to the first terminal of said second output MIS transistor.

6. A level shifter circuit according to claim 1, wherein said discharge MIS transistor has the gate terminal which is short-circuited to the gate terminal of said second output MIS transistor.

7. A level shifter circuit according to claim 1, wherein said second charge MIS transistor has the gate terminal which is short-circuited to the first terminal of said second output MIS transistor, and said discharge MIS transistor has the gate terminal which is short-circuited to the gate terminal of said second output MIS transistor.

8. A level shifter circuit according to claim 5, wherein said second charge MIS transistor has the threshold voltage of which an absolute value is greater than an absolute value of the threshold voltage of said second output MIS transistor.

9. A level shifter circuit according to claim 6, wherein said discharge MIS transistor has the threshold voltage which is almost zero.

10. A level shifter circuit according to claim 1, further comprising a switching circuit including a depression type MIS transistor which has a sixth threshold voltage and includes a first terminal applied with said input voltage and said second terminal applied with said output voltage.

11. A level shifter circuit according to claim 1, further comprising a switching circuit including an MIS transistor, said MIS transistor having a seventh threshold voltage and including a first terminal applied with said input voltage, and upon said input voltage being in said first state, becoming conductive to transfer said input voltage to a second terminal, and upon said input voltage being in said second state, providing a voltage lower than a voltage provided to a gate terminal by said seventh threshold voltage and then switching to a non-conductive state.

12. A level shifter circuit according to claim 1, further comprising a discharge element in parallel with said second output MIS transistor, said discharge element being for discharging the voltage of said second terminal of said second output MIS transistor.

13. A level shifter circuit according to claim 1, wherein said first output MIS transistor is of depression type.

14. A semiconductor memory device which includes a memory cell array with memory cells arranged in a matrix and a row decoder circuit selecting a word line of said memory cell array and transferring a voltage to the word line, wherein said row decoder circuit includes a level shifter circuit which generates an output voltage according to input of an input voltage and switches an amount of said output voltage by switching a power supply voltage of said output voltage, said level shifter circuit comprising:

a first output MIS transistor of a first conductivity having a first threshold voltage, wherein said output voltage is positively fed back to a gate terminal and said power supply voltage is applied to a first terminal to generate a first voltage at a second terminal;

a second output MIS transistor of a second conductivity type opposite to said first conductivity type having a second threshold voltage, wherein said first voltage is applied to a first terminal and a second voltage is applied to a gate terminal to control conduction to generate said output voltage at a second terminal;

a first charge MIS transistor connected between the first terminal and gate terminal of said second output MIS transistor, said first charge MIS transistor having a third threshold voltage of the same sign as said first threshold voltage, and upon said input voltage being in a first state, becoming conductive to transfer the voltage of the first terminal of said second output MIS transistor to the gate terminal to keep said second output MIS transistor non-conductive, and upon said input voltage being in a second state, charging a potential of the gate terminal of said second output MIS transistor to a potential defined by an absolute value of said third threshold voltage and switching to a non-conductive state;

a second charge MIS transistor connected between the first terminal and gate terminal of said second output MIS transistor, said second charge MIS transistor having a fourth threshold voltage of opposite sign to said first threshold voltage, and upon said first voltage being higher than said second voltage by said fourth threshold voltage, becoming conductive to charge the gate terminal of said second output MIS transistor; and a discharge MIS transistor connected between the first terminal and gate terminal of said second output MIS transistor, said discharge MIS transistor having a fifth threshold voltage of which an absolute value is smaller than said fourth threshold voltage, and upon said first voltage being lower than said second voltage by said fifth threshold voltage, becoming conductive to discharge a charge of the gate terminal of said second output MIS transistor.

15. A semiconductor memory device according to claim 14, wherein said row decoder circuit comprises a transfer transistor between the word line of said memory cell and the signal input node of said word line, and the output voltage of said level shifter circuit is provided to a gate terminal of said transfer transistor.

16. A semiconductor memory device according to claim 14, wherein said memory cell array is a NAND cell type memory cell array which comprises a NAND type cell and a select gate transistor connected to one end of the NAND type cell, and said row decoder circuit comprises a transfer transistor connected between a select gate line of said select gate transistor and a signal input node of said select gate line, and said transfer transistor has a gate terminal to which the output voltage of said level shifter circuit is applied.

17. A semiconductor memory device according to claim 16, comprising an inverter circuit which inverts said input voltage, wherein at least said second output MIS transistor has the same thickness of a gate insulating film as an MIS transistor included in said inverter circuit.

18. A semiconductor memory device according to claim 13, comprising an inverter circuit which outputs an inverted signal by inverting said input voltage, wherein said first charge MIS transistor receives said inverted signal applied to its gate terminal.

19. A semiconductor memory device according to claim 14, further comprising a switching circuit including a depression type MIS transistor which has a sixth threshold voltage and includes a first terminal applied with said input voltage and a second terminal applied with said output voltage.

20. A semiconductor memory device according to claim 14, further comprising a switching circuit including an MIS transistor, said MIS transistor having a seventh threshold voltage and including a first terminal applied with said input voltage, and upon said input voltage being in said first state, becoming conductive to transfer said input voltage to a second terminal, and upon said input voltage being in said second state, providing a voltage lower than a voltage provided to a gate terminal by said seventh threshold voltage and then switching to a non-conductive state.

21. A semiconductor memory device according to claim 14, further comprising a discharge element in parallel with said second output MIS transistor, said discharge element being for discharging the voltage of said second terminal of said second output MIS transistor.

22. A semiconductor memory device according to claim 14, wherein said first output MIS transistor is of depression type.

* * * * *